(12) United States Patent
Yanni

(10) Patent No.: US 8,913,420 B2
(45) Date of Patent: Dec. 16, 2014

(54) RANDOM ACCESS MEMORY CONTROLLER HAVING COMMON COLUMN MULTIPLEXER AND SENSE AMPLIFIER HARDWARE

(75) Inventor: Meny Yanni, Raanana (IL)

(73) Assignee: Marvell Israel (M.I.S.L) Ltd., Yokneam (IL)

(*) Notice: Subject to any disclaimer, the term of this patent is extended or adjusted under 35 U.S.C. 154(b) by 233 days.

(21) Appl. No.: 13/489,699

(22) Filed: Jun. 6, 2012

(65) Prior Publication Data

US 2012/0327703 A1 Dec. 27, 2012

Related U.S. Application Data

(60) Provisional application No. 61/499,959, filed on Jun. 22, 2011.

(51) Int. Cl.
G11C 11/00 (2006.01)
G11C 11/4091 (2006.01)
G11C 11/419 (2006.01)
G11C 7/12 (2006.01)
G11C 11/4094 (2006.01)
G11C 7/06 (2006.01)
G11C 7/00 (2006.01)
G06F 13/16 (2006.01)

(52) U.S. Cl.
CPC .......... *G11C 11/419* (2013.01); *G11C 11/4091* (2013.01); *G11C 2207/005* (2013.01); *G11C 2207/002* (2013.01); *G11C 7/12* (2013.01); *G11C 11/4094* (2013.01); *G11C 7/065* (2013.01); *G11C 7/00* (2013.01); *G06F 13/16* (2013.01)
USPC .................. 365/154; 365/189.02; 365/230.02; 365/207

(58) Field of Classification Search
CPC ............. G11C 11/413; G11C 11/5628; G11C 11/5642; G11C 7/08; G11C 16/10; G11C 16/0483
USPC ......................... 365/154, 189.02, 230.02, 207
See application file for complete search history.

(56) References Cited

U.S. PATENT DOCUMENTS

| | | | |
|---|---|---|---|
| 6,631,093 B2* | 10/2003 | Kumar et al. | 365/203 |
| 6,717,867 B2* | 4/2004 | Marr | 365/189.09 |
| 6,925,025 B2* | 8/2005 | Deng et al. | 365/226 |
| 8,027,218 B2* | 9/2011 | Sutardja et al. | 365/230.06 |
| 8,385,121 B2* | 2/2013 | Sarin et al. | 365/185.12 |
| 2011/0149667 A1* | 6/2011 | Hamzaoglu et al. | 365/203 |

* cited by examiner

Primary Examiner — Pho M Luu

(57) ABSTRACT

Systems and methods are provided for a random access memory controller. A random access memory controller includes a column multiplexer and sense amplifier pair, where the column multiplexer and sense amplifier pair includes a column multiplexer and a sense amplifier that are configured to utilize common circuitry. The common circuitry is shared between the column multiplexer and the sense amplifier so that the memory controller includes a single instance of the common circuitry for the column multiplexer and sense amplifier pair. The common circuitry includes a common pre-charge circuit, a common equalizer, or a common keeper circuit.

15 Claims, 5 Drawing Sheets

RANDOM ACCESS MEMORY CONTROLLER HAVING COMMON COLUMN MULTIPLEXER AND SENSE AMPLIFIER HARDWARE

CROSS-REFERENCE TO RELATED APPLICATIONS

This application claims priority to U.S. Provisional Patent Application No. 61/499,959, filed Jun. 22, 2011, entitled "Writeable Sense Amplifier," which is herein incorporated by reference in its entirety.

FIELD

The technology described herein relates generally to a memory controller and more particularly to a memory controller having common modules with common circuitry.

BACKGROUND

Random access memory provides a form of computer data storage, where data or groups of data can be accessed in any order. Random access memory is often volatile memory, where stored data is lost when the memory is not powered. For example, dynamic random access memory must be periodically refreshed for data to be reliably stored. In contrast, static random access memory can retain data without refreshing, as long as the static random access memory remains powered.

The description above is presented as a general overview of related art in this field and should not be construed as an admission that any of the information it contains constitutes prior art against the present patent application.

SUMMARY

Examples of systems and methods are provided for a random access memory controller. In one embodiment of the disclosure, a random access memory controller includes a column multiplexer and sense amplifier pair, where the column multiplexer and sense amplifier pair includes a column multiplexer and a sense amplifier that are configured to utilize common circuitry. The common circuitry is shared between the column multiplexer and the sense amplifier so that the memory controller includes a single instance of the common circuitry for the column multiplexer and sense amplifier pair. The common circuitry includes a common pre-charge circuit, a common equalizer, or a common keeper circuit.

In another embodiment of the disclosure, a method of reading data from a static random access memory includes receiving a data signal from a column of a static random access memory at a column multiplexer. The column multiplexer accesses data from a plurality of bit lines of the static random access memory and outputs the accessed data as a data signal in a differential signal form. Sense amplifier signal processing is performed on the data signal using a common pre-charge circuit and a common equalizer circuit. The sense amplifier signal processing receives the data signal in the differential form and amplifies voltage differences of the data signal in the differential form, where the amplified data signal is provided to an output array for storage.

DETAILED DESCRIPTION

Figure 1:
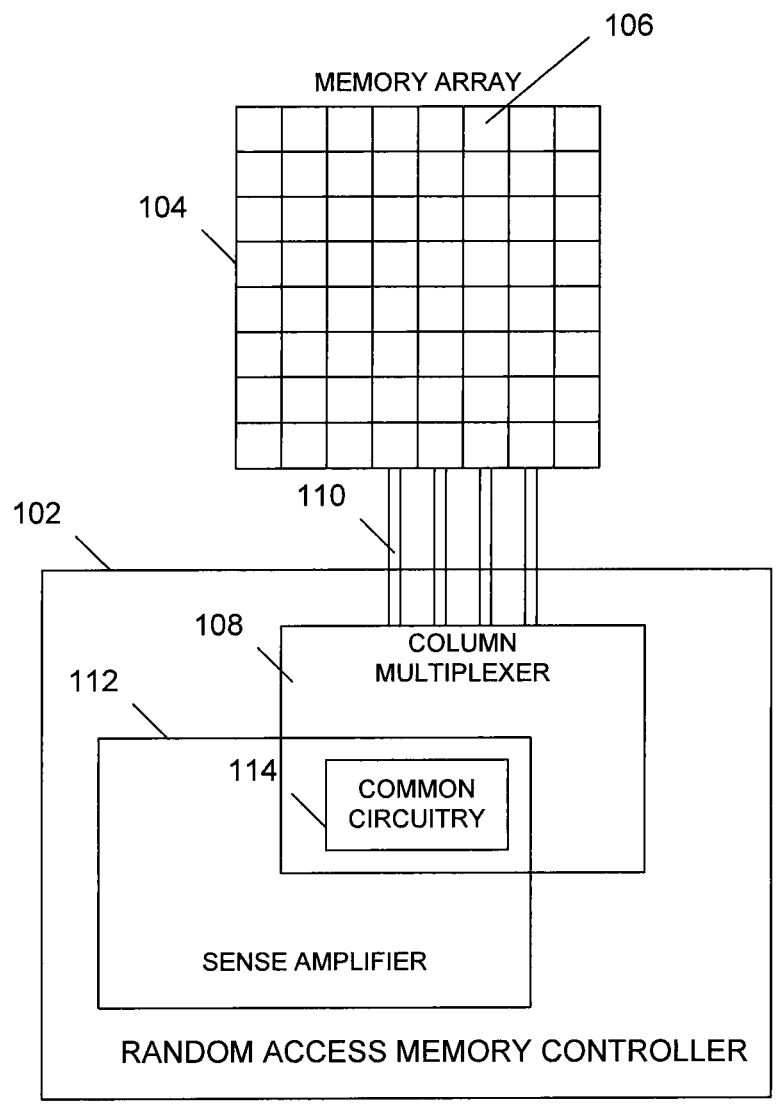
FIG. 1 is a simplified block diagram depicting a random access memory controller in accordance with an embodiment of the disclosure.

FIG. 1 is a simplified block diagram depicting a random access memory controller 102 in accordance with an embodiment of the disclosure. The random access memory controller 102 interfaces with a memory array 104 to facilitate reading data from the memory array 104 or writing data to the memory array 104. The memory array 104 could take a variety of forms. For example, the memory array 104 can be a component of a random access memory, such as a static random access memory, a non-volatile memory, an on-chip or off-chip cache memory, such as a level 1 (L1), level 2 (L2), or level 3 (L3) cache associated with a data processor, as well as other forms of memory. Cells of a memory array 104 are typically arranged into rows and columns, with one portion of data, such as a bit, being associated with each cell. The memory array 104 is accessible by columns, where all or a portion of data values in a column of the memory array 104 are outputted in series or in parallel in response to a data request. For example, when one or more data values from a sixth column 106 are requested to be read from or written to the memory array 104, all of the data values in the sixth column 106 are outputted or written to via one or more data lines 110 by the random access memory controller 102. In one embodiment, the random access memory controller 102 filters and combines data values received from the memory array 104 so that data is provided to a requesting application that meets the read data request.

The random access memory controller 102 includes circuitry that is suited for reading from and writing to the memory array. In one embodiment, the random access memory controller 102 includes a column multiplexer 108. In a read operation, a command is received by the random access memory controller 102 to access data from one or more addresses of the memory array 104. The column multiplexer 108 receives data values from a column of the memory array 104 via the one or more data lines 110 of the memory array. In one example, eight bits of data of a requested column are accessed by the column multiplexer 108 via output data lines 110 associated with that column of data. In an example, the output data lines 110 are differential data lines, where the data lines 110 provide complementary high and low voltages in a pre-defined pattern to represent different bit values.

In one embodiment, the column multiplexer 108, receives the data values and performs certain pre-processing on the data values to improve reliability of access. In one example, the column multiplexer 108 includes pre-charging circuitry, equalizing circuitry, and keeper circuitry for accessing, processing, and temporarily storing the data values for access by downstream circuitry in the data read process.

After performance of the pre-processing of the data values by the column multiplexer in a read operation, the data values are provided to a sense amplifier 112 for further processing, in an embodiment. In one embodiment, the sense amplifier 112 receives data signals representing the data values from the column multiplexer 108 in differential form and amplifies those data signals to amplify the bit line voltage difference between the two components of each differential data signal. In an embodiment, sense amplifier 112 utilizes various circuitry components for performing the amplification that are similar to circuitry components used by the column multiplexer 108. For example, the sense amplifier 112 utilizes pre-charging circuitry, equalizing circuitry, and keeper circuitry in performing the sense amplifier 112 operation; these components are also utilized by the column multiplexer 108.

The column multiplexer 108 can also operate as part of a data write operation. Upon receipt of a data write command by the random access memory controller 102 that identifies a memory array 104 address and data values to be written, the column multiplexer 108 performs certain pre-write processing using the data values to put data signals representative of those data values in a form that is appropriate for writing to the memory array 104. In one example, the column multiplexer 108 uses the same pre-charging circuitry, equalizing circuitry, and keeper circuitry described above in performing a read operation to pre-process the data values and direct the resulting data signals to the appropriate column of the memory array 104 for storage.

In traditional configurations, a column multiplexer and a sense amplifier of a random access memory controller are separate entities that utilize separate hardware for performing their designed functions. For example, a traditional column multiplexer would include its own pre-charge, equalizer, and keeper circuitry. Further, a traditional sense amplifier would include its own pre-charge, equalizer, and keeper circuitry. Such a configuration can provide robust functionality, where each of the traditional column multiplexer and traditional sense amplifier can function autonomously, using their dedicated hardware, without concern for the state of processing of the other.

However, certain synergy can be realized by implementing a random access memory controller 102 where certain circuitry is shared by the column multiplexer 108 and the sense amplifier 112, such as reduced component counts, reduced current leakages, reduced power requirements, and faster performance. In one embodiment, a random access memory controller 102 includes a column multiplexer 108 and sense amplifier 112 pair, where the column multiplexer 108 and sense amplifier pair includes a column multiplexer 108 and sense amplifier 112 that are configured to utilize common circuitry 114. The common circuitry 114 is shared between the column multiplexer 108 and the sense amplifier 112 so that the random access memory controller 102 includes a single instance of the common circuitry 114 in each column multiplexer 108 and sense amplifier pair 112. In one embodiment, the common circuitry 114 includes one or more of a common pre-charge circuit, a common equalizer circuit, and a common keeper circuit.

In one embodiment, the common circuitry 114 is used in performing multiple of the above described operations related to the memory array 104. In one example, certain of the common circuitry 114 is used in performing each of: a read operation column multiplexing operation, a read operation sense amplifying operation, and a write operation column multiplexing operation.

The use of the common circuitry 114 in place of separate, dedicated circuitry for each of: read operation column multiplexing, read operation sense amplifying, and write operation column multiplexing, can offer a number of advantages. For example, the use of such common circuitry 114 can reduce a part count of the random access memory controller 102. In one embodiment, the use of the common circuitry 114 requires fewer transistors be used in implementing the random access memory controller 102. A smaller part count can reduce parasitic leakages in the random access memory controller 102, the physical area necessary to implement the random access memory controller 102, such as in an integrated circuit, and the time necessary to perform read and/or write operations, as each part in the random access memory controller 102 can have a transient delay that can slow the overall performance of the random access memory controller 102. As an example of the possible reduction in part count of the random access memory controller 102, the number of pass devices in the read circuitry path between the column multiplexer 108 and the sense amplifier 112 can be reduced to a single pass device, where traditionally at least two are required.

Figure 2:
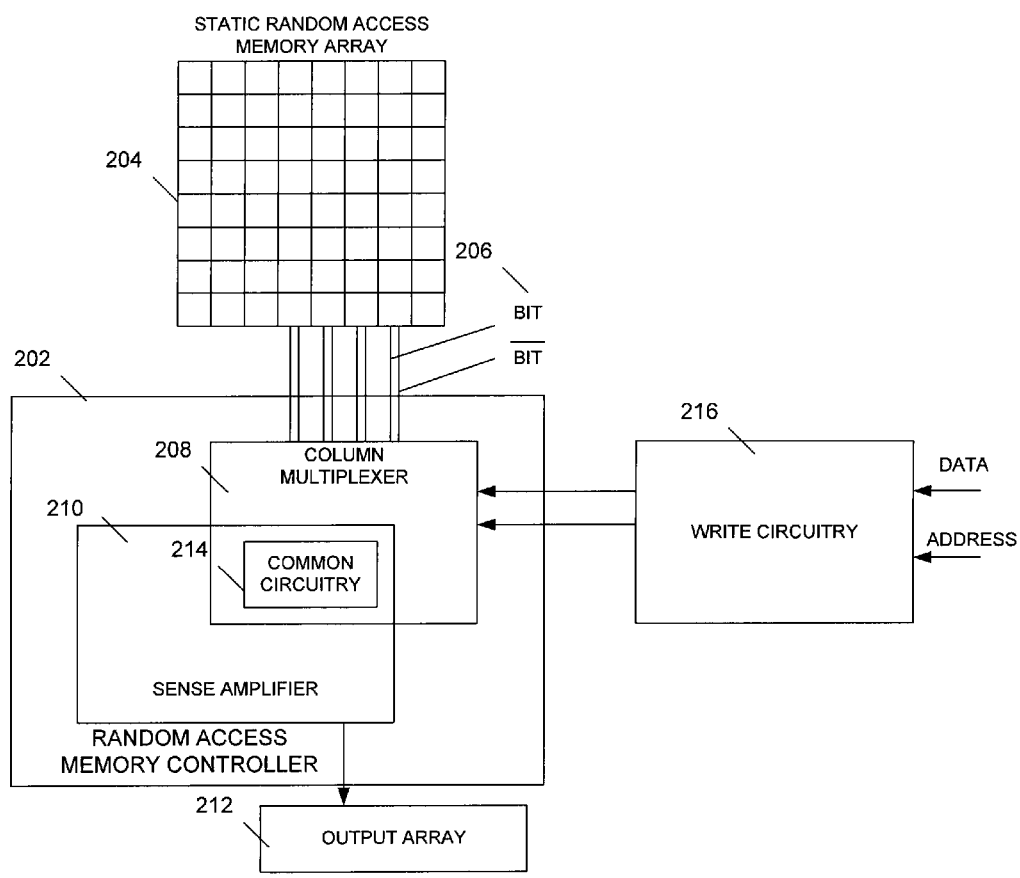
FIG. 2 is a block diagram depicting additional details of the random access memory controller embodiment of FIG. 1

FIG. 2 is a block diagram depicting additional details of the random access memory controller embodiment of FIG. 1. In the example of FIG. 2, a random access memory controller 202 interfaces with a static random access memory array 204 to perform operations that include reading data from the static random access memory array 204 and writing data to the static random access memory array 204. The random access memory controller 202 and the static random access memory array 204 communicate via differential data signal lines, as indicated at 206. Such data signal lines 206 are paired such that, in one example, one of the signal lines presents a high data signal while the other signal line presents a low data signal to represent one bit value. To represent a changing bit value, the one of the signal lines presents a low data signal while the other signal line presents a high data signal.

The random access memory controller 202 includes a column multiplexer 208 and a sense amplifier 210 pair that are configured to perform operations associated with reading one or more data values from columns of the static random access memory array 204 and transmitting read data values to an output array 212 for storage and use. The column multiplexer 208 and sense amplifier 210 pair include common circuitry that is configured to perform at least a part of both the column multiplexer 208 operations and the sense amplifier 210 operations associated with the data read operation.

The example of FIG. 2 further includes write circuitry 216 for commanding the writing of one or more data values to the static random access memory array 204. The write circuitry 216 can be separate from the random access memory controller 202 or integrated with the random access memory controller 202. The write circuitry 216 is configured to receive the data values to be written to the static random access memory array 204 along with the target address where the data is to be written in the static random access memory array 204. The write circuitry 216 processes the data to set values of bit lines to the column multiplexer 208, and the column multiplexer 208 transmits the values from those bit lines to the appropriate column of the static random access memory array, as dictated by the address. The column multiplexer 208 further processes the data signals on the bit lines from the write circuitry 216 (for example, equalizing the data signals), as described above, using the common circuitry 214, to affect reliable writing of data to the static random access memory array 204.

Figure 3:
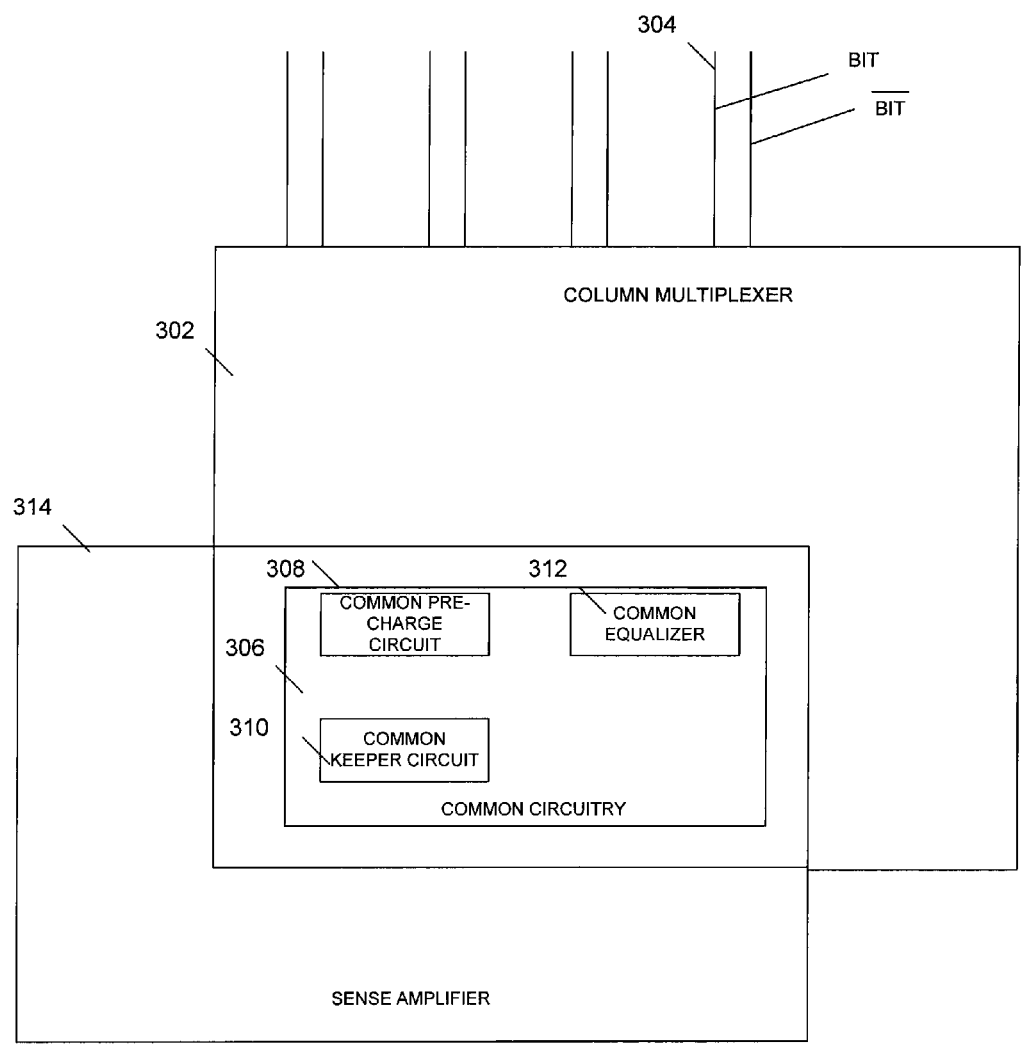
FIG. 3 is a block diagram showing an enlargement of the sense amplifier column multiplexer pair depicted in FIG. 2, including details of the common circuitry, in an embodiment.

FIG. 3 is a block diagram showing an enlargement of the sense amplifier column multiplexer pair depicted in FIG. 2, including details of the common circuitry, in an embodiment. The random access memory controller includes a column multiplexer 302 for interfacing with a memory array during data read and write operations. The column multiplexer 302 interfaces with the memory, which can be fabricated next to or near the random access memory controller or external and remote from the random access memory controller, via data lines such as the differential data lines depicted at 304. Other types of encoding can equally be used in interfacing with a memory, where different data line configuration and signaling schemes can be implemented accordingly.

In an embodiment, the column multiplexer 302 utilizes certain common circuitry 306 in performing data read and write operations. For example, when accessing data from a column of memory, the column multiplexer utilizes a common pre-charge circuit 308 to quickly sense data values from the identified column of the memory and to provide data to a common keeper circuit 310 for temporary storage. The column multiplexer 302 further utilizes a common equalizer 312 to equalize levels of the bit lines during pre-charging in preparation for the next operation, in an embodiment.

In the example, sense amplifier 314 is configured to sample the data read by the column multiplexer 302 and amplify appropriate data signals accordingly before outputting those data signals representing the read data values, such as to an external memory array. In one embodiment, the sense amplifier 314 is configured to amplify bit line voltage differences in a differentially encoded signal to improve robustness of transmission. The sense amplifier 314 utilizes certain of the common circuitry 306 in performing amplification operations. In one example, the sense amplifier 314 accesses data values stored in the common keeper circuitry 310 by the column multiplexer 302 and amplifies data signals representing those data values. In one example, the sense amplifier 314 amplifies the data signals in response to receipt of a strobe signal indicating the readiness of the data signals for amplification, as described in further detail below with respect to FIG. 5. The amplification is hastened through use of the common pre-charge circuit 308 by not having to wait for charging after data is received to perform amplification. The common equalizer 312 is used to equalize signal levels before outputting the data signals.

In an embodiment, certain of the common circuitry 306 is used by the column multiplexer in performing data write operations. An address and data to be written are received by the column multiplexer 302. The data to be written is stored in the common keeper circuit 310. Data signals representative of the data stored in the common keeper circuit 310 are amplified to an appropriate voltage for writing to an associated memory using the common pre-charge circuit 308, and signal equalizing operations are performed using the common equalizer 312 prior to writing data to the memory.

Figure 4:
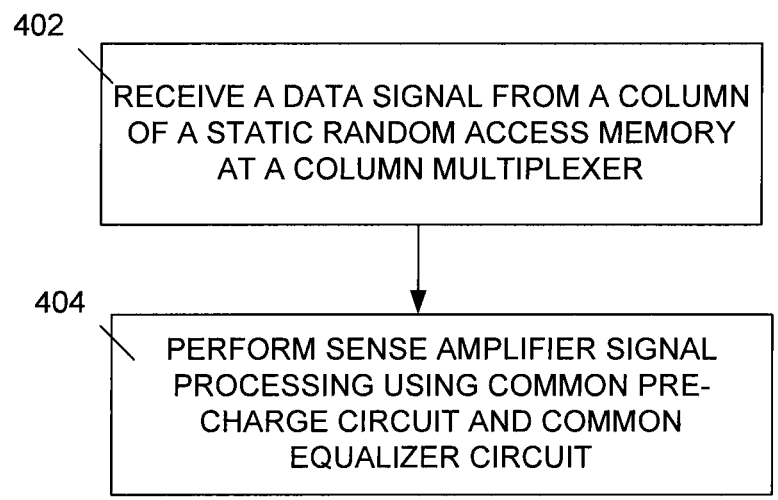
FIG. 4 is a flow diagram depicting a method of reading data from a static random access memory.

FIG. 4 is a flow diagram depicting a method of reading data from a static random access memory. A data signal is received from a column of a static random access memory at a column multiplexer at 402. The column multiplexer accesses data from a plurality of bit lines of the static random access memory and outputs the accessed data as a data signal in differential form. At 404, sense amplifier signal processing is performed on the data signal using a common pre-charge circuit a common equalizer circuit. The sense amplifier signal processing receives the data signal in the differential form and amplifies voltage differences of the data signal in the differential form. The amplified data signal is provided to an output array for storage.

Figure 5:
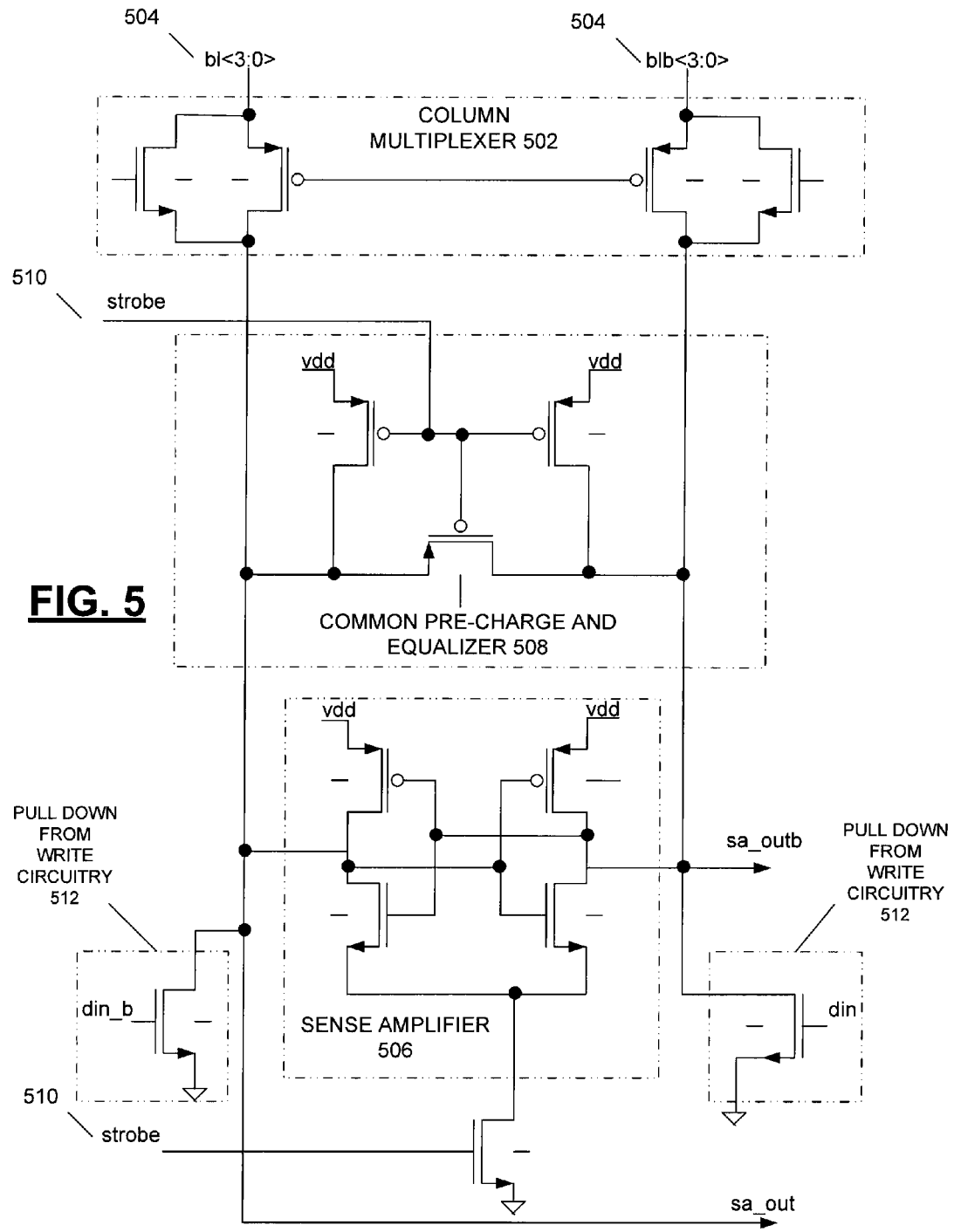
FIG. 5 is a circuit diagram depicting an example implementation of a column multiplexer and sense amplifier pair.

FIG. 5 is a circuit diagram depicting an example implementation of a column multiplexer and sense amplifier pair. A column multiplexer 502 provides two-way multiplexing between the four-bit differential data lines 504 connected to the memory with the sense amplifier 506 bit lines. A common pre-charge and equalizer circuit 508 is shared between the column multiplexer 502 and the sense amplifier 506 and performs certain operations during data read and data write operations. For example, during a data read operation, the common pre-charge and equalizer circuit 508 pre-charges the sense amplifier 506 output bit lines. During such a read operation, the sense amplifier 506 amplifies a voltage difference between the sense amplifier outputs (sa_out and sa_outb) by pulling one to $V_{DD}$ and the other to $V_{SS}$ to represent the data values accessed by the column multiplexer 502. Such amplification can be in response to receipt of a strobe signal 510 that communicates that data values have been accessed and are ready for amplification. Pull down elements 512 receive commands from write circuitry to pull down the sense amplifier bit lines and the relevant bit lines from the upper side of the column multiplexer 502 during a write operation based on the data provided on the din and din_b inputs.

The patentable scope of the claims may encompass examples other than those specifically discussed above. For example, a random access memory controller can be implemented in a number of different arrangements and be configured to operate as part of many different applications. For example, one or more random access memory controllers can be fabricated on a memory integrated circuit (chip) along with a memory array. In another example, a random access memory controller is located remote from the memory array, such as by being disposed on a different integrated circuit. The random access memory controller can also be incorporated into a data processor integrated circuit. For example, a random access memory controller and associated memory array can be implemented as part of an on-chip cache, such as a level 1 (L1), level 2 (L2), or level 3 (L3) cache, to provide on-chip memory access to a data processor. A random access memory controller can be configured to participate in performing any number of operations such as a look-up table, a data buffer, or a logic block, as well as many others.

What is claimed is:

1. A random access memory controller, comprising:
a column multiplexer and sense amplifier pair, wherein the column multiplexer and sense amplifier pair includes a column multiplexer and a sense amplifier that are configured to utilize common circuitry, wherein the common circuitry is shared between the column multiplexer and the sense amplifier so that the memory controller includes a single instance of the common circuitry for the column multiplexer and sense amplifier pair, wherein the common circuitry includes a common pre-charge circuit, a common equalizer, or a common keeper circuit;
wherein the column multiplexer and sense amplifier pair is configured to perform a column selection operation, wherein the column selection operation utilizes the common circuitry, wherein the column multiplexer and sense amplifier pair is further configured to perform a sense amplification operation, wherein the sense amplification operation also uses the same common circuitry.

2. The controller of claim 1, wherein the column multiplexer and sense amplifier pair are configured for connection to a static random access memory array.

3. The controller of claim 2, wherein only a single pass-device transistor is connected in series between a column of the memory array and the column multiplexer and sense amplifier pair.

4. The controller of claim 2, further comprising write circuitry, wherein the write circuitry is configured to transmit a data value and a memory location to the column multiplexer and sense amplifier pair to facilitate writing the data value to the memory location of the static random access memory.

5. The controller of claim 2, wherein the column multiplexer is configured to send or receive data from one of a plurality of columns of the memory.

6. The controller of claim 5, wherein the column multiplexer is configured to send or receive data using differential data signals.

7. The controller of claim 2, wherein the column multiplexer and sense amplifier pair is fabricated on a same integrated circuit as the memory array.

8. The controller of claim 2, wherein the memory array is external to an integrated circuit on which the column multiplexer and sense amplifier pair is fabricated.

9. The controller of claim 1, wherein the common circuitry further includes a timing circuit, wherein the timing circuit is configured to eliminate a race condition in the column multiplexer and sense amplifier pair.

10. The controller of claim 1, wherein the sense amplification operation amplifies a bit line voltage difference of data received from a selected column of memory array, wherein the selected column is selected via the column selection operation.

11. The controller of claim 10, wherein the common circuitry is configured to amplify the bit line voltage difference during the sense amplification operation in coordination with receipt of a strobe signal.

12. The controller of claim 1, wherein the controller is a part of a processor cache.

13. The controller of claim 12, wherein the controller is a part of a level 1 (L1), a level 2 (L2), or a level 3 (L3) cache.

14. The controller of claim 1, wherein the controller is configured to operate in implementing a look-up table, buffer management, or a logic block.

15. A random access memory controller, comprising:
a column multiplexer and sense amplified pair, wherein the column multiplexer and sense amplifier pair includes a column multiplexer and a sense amplifier that are configured to utilize common circuitry, wherein the common circuitry is shared between the column multiplexer and the sense amplifier so that the memory controller includes a single instance of the common circuitry for the column multiplexer and sense amplifier pair, wherein the common circuitry includes a common precharge circuit, a common equalizer, or a common keeper circuit;
wherein the common circuitry includes the common keeper circuit, wherein the common keeper circuit is configured to receive and hold a first data signal level for subsequent access.

* * * * *